United States Patent [19]

Pleitz

[11] Patent Number: 5,783,970
[45] Date of Patent: Jul. 21, 1998

[54] DRIVER FOR N-CHANNEL VFET OUTPUT STAGE OF POWER AMPLIFIER

[75] Inventor: Joseph J. Pleitz, Tempe, Ariz.

[73] Assignee: Mitek Corporation, Phoenix, Ariz.

[21] Appl. No.: 738,412

[22] Filed: Oct. 25, 1996

Related U.S. Application Data

[63] Continuation-in-part of Ser. No. 506,412, Jul. 24, 1995, Pat. No. 5,631,608.

[51] Int. Cl.⁶ ...................................................... H03F 3/26
[52] U.S. Cl. ............................................ 330/269; 330/272
[58] Field of Search .................................... 330/255, 269, 330/271, 272, 289, 298, 300

[56] References Cited

U.S. PATENT DOCUMENTS

| | | | |
|---|---|---|---|
| 4,093,925 | 6/1978 | Yokoyama | 330/270 X |
| 4,241,313 | 12/1980 | Takehara | 330/269 X |
| 5,477,188 | 12/1995 | Chawla et al. | 330/269 |
| 5,498,997 | 3/1996 | Schiebold | 330/269 X |
| 5,537,080 | 7/1996 | Chawla et al. | 330/269 X |
| 5,631,608 | 5/1997 | Pleitz | 330/255 |

*Primary Examiner*—Steven Mottola
*Attorney, Agent, or Firm*—Quarles & Brady

[57] ABSTRACT

An input driver stage for an audio power amplifier wherein the amplifier incorporates only N-channel VFETs in the output stage, the invention locks the currents in second stage (via a closed loop) which is directly connected to the VFET output stage thus allowing precise open loop predictive temperature compensated programming of the quiescent operating point of the VFET output stage into an acceptable linear area of operation—without fettering the amplifiers inherent straight forwardness of implementation or the amplifiers excellent signal amplification characteristics.

16 Claims, 3 Drawing Sheets ns5,783,970

DRIVER FOR N-CHANNEL VFET OUTPUT STAGE OF POWER AMPLIFIER

This is a continuation-in-part of application Ser. No. 08/506,412 filed Jul. 24, 1995, now U.S. Pat. No. 5,631,608.

FIELD OF THE INVENTION

This invention relates generally to the field of power audio amplifiers and specifically to an improved driver stage for an N-channel VFET output power amplifier.

BACKGROUND OF THE INVENTION

The requirements for audio power amplifiers are increasingly becoming more and more demanding. This is especially true in the field of mobile audio power amplifiers, where recent advances in consumer technology have delivered very high quality signal sources and output transducers to the general populous.

In response to these conditions in the market place, astute designers have adopted the power voltage field effect transistor (VFET) as the output device of choice for bilateral class AB linear power amplifiers. This choice stems mainly from the recognition of the power VFET's superiority in terms of ruggedness, linearity, speed and drive requirements relative to that of other power device technologies. Interestingly, most modern day power VFET amplifiers that have been devised utilize complementary VFET output devices (P & N) in the power output stage. The one significant short coming of this configuration is the cost and performance penalties of the P type VFET. For example, the P type VFET usually costs about twice that of the N type VFET and delivers only about 70% of the gain, usually with a decrease in speed. This unfortunate situation has led designers to pursue amplifiers where all of the output devices are N-channel VFET's. Several designs have been conceived and reduced to practice but they are plagued by problems in three key areas. The problem areas include: (1) lack of stable output stage bias compensation with simple circuitry that does not impair rail to rail output swing under load; (2) excessive common mode conduction in the output stage VFET's; and (3) unsatisfactory high frequency distortion characteristics with simple circuitry (no more than 3 active devices per stage, 2 serial stages maximum).

The first problem area, lack of stable output stage bias compensation, has been solved by placing a sensing device with a negative temperature coefficient in proximity to the output devices (i.e. the heat sink) and having the sensing device control the output stage bias via thermal feedback. Previous embodiments of this technique in N type VFET output stage amplifiers have required the control of the sensor to be effected or "programmed" from two or three stages away from the control "target" (i.e. gate-to-source junction of the VFET) in an open loop manner, consequently, excessive and unsatisfactory drift of the bias point occurs.

Temperature independent biasing of the output stage has also been achieved via all electronic techniques (i.e. no thermal feedback). Electrically controlled output stage idle current is achieved by actively monitoring the output stage bias current and comparing it to a predetermined reference via electronic negative feedback. The shortcoming of this approach has always been one of separating the class A idle currents (e.g. 50 ma) from the large class B peak currents (e.g. 30 A) that flow through the sense point node. A few designs have managed to pull this off, however, the complexity of this resultant "Autobias" circuitry strongly offsets any real gain in almost any conceivable circumstances.

The common mode problem has been solved in the past by reducing the voltage swing of the output stage. However, in reduced load impedance applications, reduced voltage swing causes unacceptable power loss in the output stage. The source of the problem stems from the input capacitance of the VFET. Adequate charging and discharging currents must be made available at the highest operating frequency if common mode output stage currents are to be avoided at full rail to rail output swing. The prior art has not allowed for this in a simple non-parts intensive way.

The distortion problem has been solved via application of additional stages of gain to increase the correction power of the loop. This has achieved a certain measure of success, however, a substantial penalty has been paid in terms of increased circuit complexity.

SUMMARY OF THE INVENTION

It is the principal object of the present invention to overcome the problems cited above which are largely the result of poorly designed/conceived input driver circuitry. The present invention introduces a number of improvements/new approaches in said driver circuits that make it possible to realize simple, high performance, all N type output stage VFET audio power amplifiers.

Specifically, the invention includes an input stage of an audio amplifier for use with an output stage having first and second N-channel VFETs, the amplifier receiving an audio input signal on an input line and producing an output signal on an output line. The amplifier also provides positive and negative DC voltage sources. Each VFET has a gate terminal. The input stage comprises a differential amplifier receiving both the audio input signal and the output signal and generating difference signals at first and second nodes. An amplifier stage includes first and second amplifying junction transistors having base, emitter, and collector terminals, a mirror stage including first and second mirror junction transistors having base, emitter, and collector terminals, and first, second, and third biasing resistors. The bases of the first and second amplifying transistors are connected at the first and second nodes respectively. The emitters of the first and second amplifying transistors are connected to the bases of the first and second mirror transistors respectively and to the positive DC voltage source through the first biasing resistor. The emitters of the first and second mirror transistors are connected to positive DC voltage source. The collector of the first amplifying transistors is connected to the output line through the second biasing resistor while the collector of the second amplifying transistor is connected to the negative DC voltage source through the third biasing resistor. In addition, the collectors of the first and second amplifying transistors are connected to the gate terminals of the first and second VFETs respectively. The first and second mirror transistors lock an emitter to collector current through each of the first and second amplifying transistors so as to program a gate voltage at the VFET gate terminals into a desired region.

Another object of the invention is to lock the emitter to collector currents flowing through junction transistors which are connected directly to the gate terminals of the output VFETs into regions that effectively program the gate voltages into a desired linear region of operation. By tying the base and collector terminals of the mirror transistors to the emitter and base terminals of the amplifying transistors respectively, and by defining the voltage across the first biasing resistor, the emitter to collector currents through the amplifying transistors can be substantially locked so that they do not vary appreciably as a function of temperature.

Another object of the invention is to program the VFET gate voltages in a simple and inexpensive manner. The present invention programs the gate voltages with minimal components, thus keeping the cost of the configuration to a minimum.

Yet another object of the invention is to minimize distortion in the output signal from an audio amplifier. The present invention minimizes distortion by minimizing the variation in transistor operation generally despite changes in temperature.

A further object of the invention is to provide a stable amplifier with excellent frequency response without a complicated circuit. Because the present invention has a minimal number of stages, frequency response is superb and high distortion is limited.

Yet another object of the invention is to provide a driver stage for an N-channel VFET output stage which facilitates maximum output signal swing despite ambient temperature. By choosing resistive values appropriately in the input driver stage of the present invention, output VFETs can be biased so that maximum swing can be attained.

These and still other objects and advantages of the invention will become apparent from the description which follows. In the description, the preferred embodiments will be described with reference to the accompanying drawings. These embodiments do not represent the full scope of the invention. Rather, reference should be made to the claims herein for interpreting the full scope of the invention.

DETAILED DESCRIPTION OF THE PREFERRED EMBODIMENT

Figure 2:
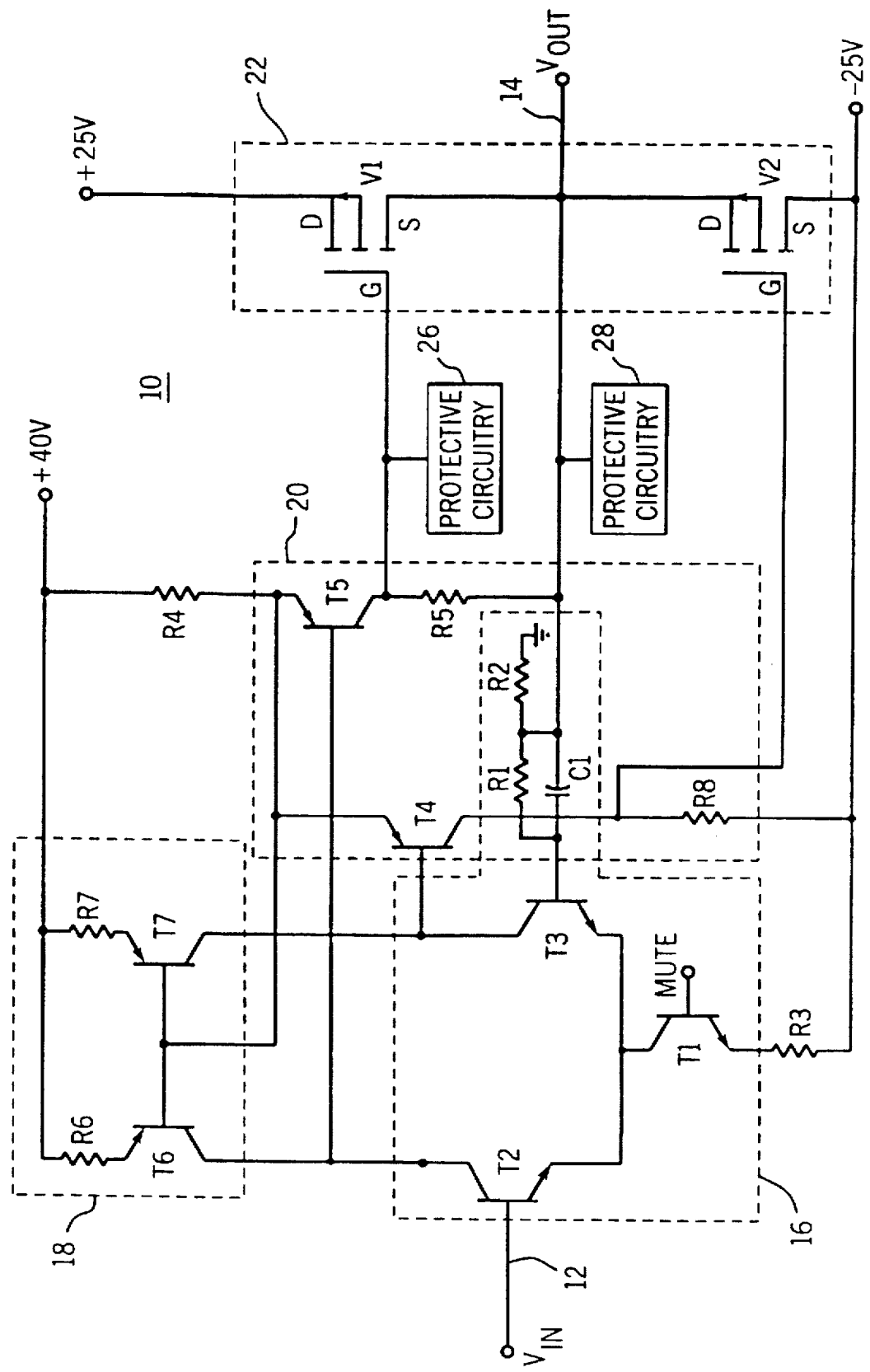
FIG. 2 is a schematic circuit diagram of an embodiment of an amplifier including the inventive input driver stage.

Referring to FIG. 2, the present invention will be described in the context of an exemplary amplifier 10 which receives an audio input signal on line 12 and generates a similar audio output signal on output line 14 which has a characteristically higher relative power level than the corresponding input signal. The amplifier includes a plurality of bipolar small signal junction transistors T1–T7, two metal vertical field effect transistors (VFETS) V1 and V2, and a number of other familiar electrical components which together configure several amplifier sections which are important for the purposes of understanding the invention. The four amplifier sections include a differential amplifier stage 16, a differential mirror 18, a current conveyor stage 20, and an output stage 22.

In the description that follows, standard schematic symbols are used to represent both the junction transistors T1–T7, each of which has three terminals identified as emitter (terminal including arrow), collector (opposite emitter) and base, and VFETs V1 and V2, each of which includes drain, source, and gate terminals (labelled G, S, and D respectively). Various resistors, capacitors and diodes which would typically be included in an amplifier circuit for coupling circuit portions have been omitted. These amplifier components, their uses, and how to implement them, are well known and are not related to the novelty of the present invention. Therefore, to simplify this description, these components have been omitted.

DC voltage is provided to the amplifier 10 by a power source (not shown) as well known in the industry. Two levels of positive DC voltage are provided including 40 volts and 25 volts and a single level negative 25 volt DC rail is supplied.

The differential amplifier stage 16 includes three junction transistors T1–T3, three resistors R1–R3, and a capacitor C1. The third resistor R3 is connected between the negative DC rail and the emitter of the first transistor T1. The base of the first transistor T1 is connected to a MUTE terminal. The collector of the first transistor T1 is connected to the emitters of second and third transistors T2 and T3. The base of the second transistor T2 is connected to the input line 12 and the base of the third transistor T3 is connected to output line 14 through the parallel configuration of capacitor C1 and resistor R1. The second resistor R2 is connected between the first resistor R1 and ground.

The second and third transistors T2, T3 form what is commonly referred to as a differential amplifier. The differential amplifier receives two signals, in this case the input and output signals from lines 12 and 14, and draws current from the two transistor collectors in proportion to the difference between the two signals. Thus, where the input and output signals are identical (identical portions of signals are referred to as common mode signals), the second and third transistors T2, T3 should both conduct the same amount of current. Where the input and output signals are different, one transistor of the two T2, T3 conducts more current and the other conducts less in complementary proportions. Therefore, the collector currents of the second and third transistors T2, T3 are together indicative of the differential between the input and output signals.

Because the output signal is an amplified version of the input signal, the output signal must be stepped down prior to being compared to the input signal by the differential amplifier. To this end, second and third resistors R2 and R3 form a voltage dividing network with capacitor C1. The resistor values should be chosen so as to step the output signal down by the value of the intended amplification. For example, where the amplifier is designed to step voltage up by a factor of ten, resistor R3 should be one-tenth the value of resistor R2. Generally, the differential amplifier stage 16 and variations thereof are well known in the art.

The current conveyor stage 20 includes fourth and fifth junction transistor T4 and T5 and fourth, fifth, and eighth resistors R4, R5, and R8. The bases of the fourth and fifth transistors T4 and T5 are connected to the collectors of the third and second transistors T3 and T2 respectively. Each of the fourth and fifth transistor T4 and T5 emitters are connected through the fourth resistor R4 to the 40 volt DC rail. The fourth transistor's collector is connected to the negative 25 volt DC rail through the eighth resistor R8 while the fifth transistor's collector is connected to the output line 14 through the fifth resistor R5. Resistors R5 and R8 have identical values.

The differential mirror 18 (generally referred to as a current mirror), includes sixth and seventh junction transistors T6, T7 and sixth and seventh resistors R6, R7. The collectors of transistors T6 and T7 are connected to the collectors of the second and third transistors T2, T3 respectively and their emitters are connected through sixth and seventh resistors R6, R7 to the 40 volt DC rail. The bases of transistors T6 and T7 are connected together and connected to the emitters of both the fourth and fifth transistors T4, T5.

Resistors R6 and R7 have identical values and the transistors T6 and T7 should have identical input and output characteristics. When transistors T6 and T7 are biased on, the emitter to collector currents are mirror images (i.e. identical) and hence the term current mirror.

The output stage 22 includes the first and second VFETs V1 and V2. The gates of the first and second VFETs are connected to the collectors of the fifth and fourth transistors T5, T4 respectively. The drain of the first VFET V1 is connected to the positive 25 volt DC rail while its source is connected to the output line 14. The drain of the second VFET V2 is connected to the output line 14 while its source is connected to the negative 25 volt DC rail.

While not shown in detail, protection circuitry 26, 28 is identified between the collectors of the fifth and fourth transistors T5, T4 and the VFETs V1, V2. This circuitry can take many different forms which are well known in the industry and is not important to an understanding of what is novel here. Therefore, the protection circuitry is not explained in detail.

In operation, with the proper voltage on the base of the first transistor T1, the first transistor T1 will function to provide a virtually constant current for the differential pair of transistors T2–T3. With no signal applied to line 12, current flows equally through transistors T2 and T3. The respective collector currents of transistors T2 and T3 "pull" the bases of transistors T4 and T5 down, therefore turning these devices on. The current flowing in transistors T4 and T5 will cause a potential to appear across the fourth resistor R4. When the potential across resistor R4 reaches the level necessary to bias the base emitter junctions of transistors T6 and T7, these devices will become active and steer current away from transistors T4 and T5, thus forming a local negative feedback loop with the base-to-emitter voltage Vbe of each of the sixth and seventh transistors T6 and T7 plus the potentials across resistors R6 and R7—serving as the reference voltage that maintains the voltage across resistor R4. The total current that flows in the fourth and fifth transistors T4 and T5 is a function of the base-to-emitter voltages Vbe of transistors T6 and T7 plus the drops across R6 and R7.

Thus with the proper selection of resistances for R4, R5 and R8, the bias voltage applied to the gate-to-source junctions of V1 and V2 can be made to decrease as the temperatures of transistors T6 and T7 increase. By placing transistors T6 and T7 in thermal contact with a heat sink that VFETs V1 and V2 are mounted on, thermal compensation can be achieved. In other words, as the VFET's V1 and V2 heat up, the gate-to-source bias voltage $V_{GS}$ necessary to achieve a given drain current will decrease. Consequently if we want to hole the quiescent operating currents of V1 and V2 stable despite changes in temperature, we must, in a complementary fashion, turn down the gate-to-source biasing voltages $V_{GS}$ as V1 and V2 heat up.

For example, since the gate-to-source temperature coefficients of V1 and V2 are approximately –6 mV/°C, and the base-to-emitter Vbe temperature coefficients of transistors T6 and T7 are approximately –2 mV/°C., to match components properly, resistor R4 would have to be 6 times smaller than resistors R5 and R8. Referring still to FIG. 2, assuming a 1° C. decrease in component temperature, there will be a 6 mV decrease in first and second VFET gate-to-source biasing voltages. Hence, the voltage drop required across the fifth and either resistors R5, R8 to maintain the VFETs at the same biasing point as before the 1° C. temperature drop is 6 mV. This 6 mV decrease in fifth and eighth resistor potential drops can be achieved by decreasing the current through those resistors R5 and R8. Because the currents through resistors R5 and R8 together equal the current through R4, the voltage drops across R5 and R8 can be controlled. As indicated above, the base-to-emitter voltage $V_{be}$ of the sixth and seventh transistors T6, T7 also changes with temperature by –2 mV/°C. and hence, with the present invention configuration, the voltage drop, and therefore current through, the fourth resistor R4 decreases with increasing temperature. Thus, by simply choosing resistor values R4, R5 and R8 appropriately, the required –6 mV/°C. voltage change across resistors R5 and R8 can be programmed. Assuming R8 is non-conducting, all of the current through R4 would pass through R5, so that from I=V/R:

$$\frac{V5}{R5} = \frac{V4}{R4} \quad (1)$$

Rearranging equation 1:

$$\frac{R5}{R4} = \frac{V5}{V4} \quad (2)$$

From Eq. 2, knowing that the voltage drop across resistor R4 will be 2 mV/°C. and that a 6 mV/°C. drop is required across each of resistors R5 and R8, the ratio of resistance R4 to resistances R5 and R8 in parallel is 6 to 2 or 3 to 1. Because R5 and R8 are in parallel, the ratio of R4 to either R5 or R8 is 6 to 1. Hence, where resistance R4 is chosen to be 50Ω R5 and R8 will be approximately 300Ω each.

The arrangement of transistors T4, T5, T6 and T7 has additional benefits. Namely as was stated T4 and T5's current are referenced or locked to the base-to-emitter voltages Vbe of transistors T6 and T7. This means that temperature variations in transistors T4 and T5 will not effect the current these transistors are programmed to conduct. Since transistors T4 and T5 will typically dissipate 0.35 watts each, the small transistor cases will heat rapidly and become quite warm. However, with the current through transistors T4 and T5 held constant by transistors T6 and T7 no change or drift in the bias points of V1 and V2 will occur due to base-to-emitter Vbe drift in transistor T4 and T5. This is a very significant and desirable feature since this was previously a major cause of bias instability in previous designs.

Additionally, it should be pointed out that by increasing or decreasing the voltage on the mute node or base of transistor T1, more or less current can be caused to flow through transistor T2 and T3. This current will respectively increase or decrease the drop across resistors R6 and R7 thus providing a means to adjust the voltage across resistor R4 which is really a measure of the bias voltage produced at the gate-to-source junctions of the VFETs V1 and V2. Thus by adjusting the first transistor's T1's current we can adjust the quiescent operating points of V1 and V2 without affecting the gate-to-source bias temperature coefficient term.

Most of the preceding description explains how the invention works with respect to stabilizing the output stage bias compensation. The common mode conduction problem is substantially mitigated by the above described circuit in so much as transistors T3 and T4 can be run at relatively high collector (since their drift has been eliminated and won't cause output stage bias changes) currents which allows the gate-to-source resistance of the VFETs to be set low enough to keep the R*Cin product of each VFET sufficiently small so as to allow high frequency operation.

The third problem, that of providing increased loop gain to lower distortion is solved mainly through the action of transistors T5, T6, T4 and T3 under differential excitation.

Briefly, the common mode impedance of the collectors of transistors T5 and T6 is a couple hundred ohms, however, the differential impedance is on the order of 1 Megohm thus allowing very high differential voltage gain and therefore a high intra loop gain.

Figure 3:
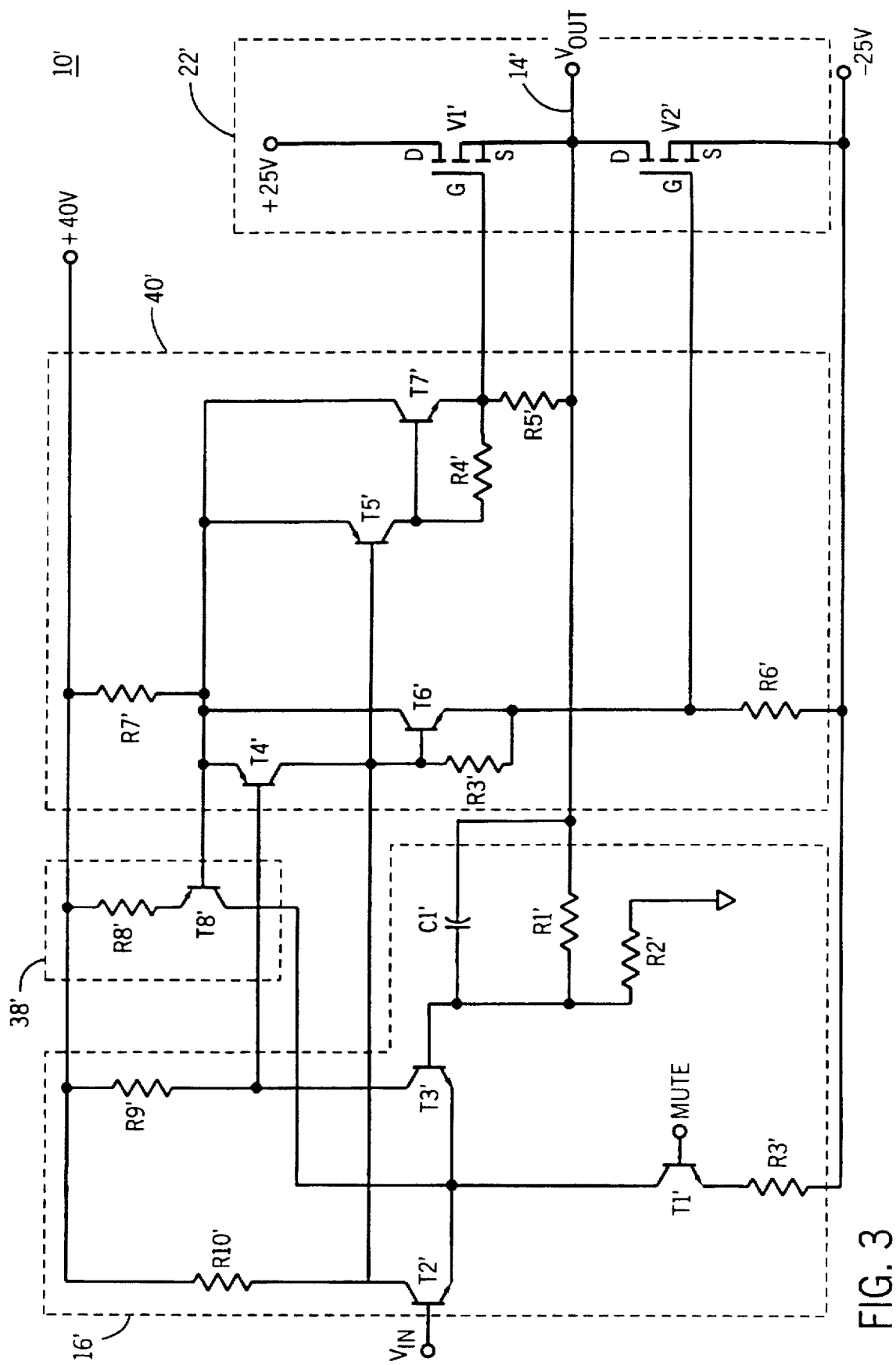
FIG. 3 is a schematic circuit diagram of a second embodiment of an amplifier including an inventive driver stage.

Referring now to FIG. 3, a second embodiment of an inventive audio input driver stage and amplifier can be observed. In FIG. 3, the amplifier 10' receives an audio input signal on line 12' and generates a similar audio output signal on output line 14' which has a characteristically higher relative power level than the corresponding input signal. The amplifier includes a plurality of bipolar small signal junction transistors T1'–T8', two metal vertical field effect transistors (VFETS) V1' and V2', and a number of other familiar electrical components which together configure four amplifier sections which are important for the purposes of understanding the second embodiment of the invention. The four amplifier sections include a differential amplifier stage 16', a common mode mirror 38, a current conveyor stage 40, and an output stage 22'.

Two levels of positive DC voltage including 40 volt and 25 volt sources and a single negative 25 volt source are provided to the amplifier 10' by a power source (not shown).

The differential amplifier stage 16' is similar to the one discuss above and includes three junction transistors T1'–T3', the resistors R1', R3', R9', R10' and a capacitor C1'. The third resistor R3' is connected between the negative DC rail and the emitter of the first transistor T1'. The base of the first transistor T1' is connected to a MUTE terminal. The collector of the first transistor T1' is connected to the emitters of the second and third transistors T2' and T3'. The base of the second transistor T2' is connected to the input line 12' and the base of the third transistor T3' is connected to the output line 14' through the parallel configuration of capacitor C1' and resistor R1'. The second resistor R2' is connected between the base of the third transistor T3' and ground.

As with the first embodiment, the second and third transistors T2', T3' form what is commonly referred to as a differential amplifier. The differential amplifier receives two signals, in this case the input and output signals from lines 12' and 14', and draws current from the two transistor collectors in proportion to the difference between the two signals. Thus, where the input and output signals are identical (identical portions of signals that are referred to as common mode signals), the second and third transistors T2', T3' should both conduct the same amount of current. Where the input and output signals are different, one transistor of the two T2', T3' conducts more current and the other conducts less in complimentary proportions. Therefore, the collect currents of the second and third transistors T2', T3' are together indicative of the difference between the input and output signals.

Because the output signal is an amplified version of the input signal, the output signal must be stepped down prior to being compared to the input signal by the differential amplifier. To this end, first and second resistors R1' in R2' form a voltage dividing network with capacitor C1'. The resistor values should be chosen so as to step the output signal down by the value of the intended amplification. For example, where the amplifier is designed to step voltage up by a factor of 10, resistor R1' should be 1/10 the value of resistor R2'. Generally, the differential amplifier stage 16' and variations thereof are well known in the art.

The current conveyor stage 20 includes four junction transistors referred to by the numerals T4'–T7' and five resistors referred to as R3'–R7'. The bases of transistors T4' and T5' are connected to the collectors of the third and second transistor T3' and T2' respectively. Each of the transistor T4' and T5' emitters are connected through resistor R7' to the 40 volt DC rail. The collector of transistor T4' is connected to the negative 25 volt DC rail through series resistors R3' and R6' while the collector of transistor T5' is connected to the output line 14' through the series resistors R4' and R5'.

The collectors of transistors T6' and T7' are connected to the 40 volt DC rail through resistor R7' and there bases are connected to the collectors of transistors T4' and T5' respectively. The emitter of transistor T6' is connected to a node between series coupled resistors R3' and R6' which is also connected to the gate of the second VFET V2'. The emitter of transistor T7' is connected at a node between series coupled resistors R4' and R5' which is also connected to the gate terminal of the first VFET V1'.

The common mode mirror stage 38 includes transistor T8' and resistor R8'. The emitter of transistor T8' is connected to the 40 volt DC rail through resistor R8'. The base of transistor T8' is connected through resistor R7' to the 40 volt DC rail. Thus, resistor R7' is in a parallel relationship with the series arranged resistor R8' and the $V_{be}$ junction of transistor T8'. The collector of transistor T8' is connected to the collector of transistor T1'. Resistor R9' connects the base of transistor T4' to the 40 volt DC rail. Similarly, resistor R10' connects the base of transistor T5' to the 40 volt DC rail. Resistors R9' and R10' have identical values.

The output stage 22' includes the first and second VFETs V1' and V2'. As indicated above, the gates of the first and second VFETs are connected to the emitters of transistors T7' and T6' respectively. The drain of the first VFET V1' is connected to the positive 25 volt DC rail while its source is connected to the output line 14'. The drain of the second VFET V2' is connected to the output line 14' while its source is connected to the negative 25 volt DC rail. As with the first embodiment, the second embodiment may include protection circuitry (not shown) adjacent the VFETs V1' and V2'.

In operation, with proper voltage on the base of the first transistor T1', the first transistor T1' will provide a virtually constant current for the differential pair of transistors T2'–T3'. With no signal applied to line 12', current flows equally through transistor T2' and T3'. The respective collector currents of transistors T2' and T3' "pull" the bases of transistors T4' and T5' down, thereby activating the compound differential. The current flowing in transistors T4' and T5' cause a potential to appear across resistors R7'. When the potential across resistor R7' reaches the level necessary to bias the base-to-emitter junction of transistor T8' on, transistor T8' becomes active and steers current away from the second and third transistors T2' and T3' respectively, which in turn reduces the current flowing in the compound differential stage 40'. This forms a local negative feedback loop with the base-to-emitter voltage $V_{be}$ of transistor T8' plus the potential across resistor R8' serving as a reference voltage that maintains the voltage across resistor R7'. The total current that flows through the compound connection of transistors T4'–T7' is a function of the base-to-emitter voltage $V_{be}$ of transistor T8' and the voltage drop across the resistor R8'.

The scaling of resistors R3' and R5' to that of R7', is such that the differential compound (T4'–T7') is biased to operate linearly at currents below the operating current that causes transistor T8' to bias. This ensures that transistors, T4'–T7' operate as a seamless high gain, linearized substitute for transistors T4' and T5' of the first embodiment.

With proper selection of resistances R5', RG' and R7', the biased voltage applied to the gate-to-source junctions of VFETs V1' and V2' can be made to decrease as the temperature of transistor T8' increases. By placing transistor T8' in thermal contact with a heat sink that VFETs V1' and V2' are mounted on, thermal compensation can be achieved. In other words, as the VFETs V1' and V2' heat up, the gate-to-source bias voltage $V_{GS}$ necessary to achieve a given drain current will decrease. Consequently, if you want to hold the quiescent operating currents of V1' and V2' stable despite changes in temperature you must, in a complimentary fashion, turn down the gate-to-source biasing voltages $V_{GS}$ as VFETs V1' and V2' heat up.

For example, since the gate-to-source temperature coefficients of V1' and V2' are approximately –6 mV/°C. and the base-to-emitter $V_{be}$ temperature coefficient of transistor T8' is approximately –2 mV/°C., to match components properly, resistor R7' would have to be 6 times smaller than resistors R5' and R6'. Referring still to FIG. 3, assuming a 1° C. decrease in component temperature, there will be a 6 mV decrease in the first and second VFET gate-to-source biasing voltages. Hence, the voltage drop required across the resistors R5', R6' to maintain the VFETs at the same biasing point as before the 1° C. temperature drop is 6 mV. This 6 mV decrease in resistor potential drops across R5' and R6' can be achieved by decreasing the current through those resistors. Because the currents through resistor R5' and R6' equal the current through resistor R7', the voltage drops across R5' and R6' can be controlled by controlling the voltage drop across resistor R7'.

As indicated above, the base-to-emitter voltage $V_{be}$ of transistor T8' also changes with temperature by –2 mV/°C. and hence, with the present inventive configuration, the voltage drop across, and therefore current through, resistor R7' decreases with increasing temperature. Thus, by simply choosing resistor values R5', R6', and R7' appropriately, the required –6 mV/°C. voltage change across resistors R5' and R6' can be programmed. As explained above with respect to the first embodiment, with the second embodiment, where the resistance R7' is 50 ohms, R5' and R6' should be chosen to be approximately 300 ohms each.

The second embodiment in FIG. 3 advantageously requires one less transistor in the feedback stage 38 (referred to above as the differential mirror 18 in FIG. 2). In addition, despite requiring two additional transistors in the conveyor stage 40, the second embodiment has greater linearity than the first embodiment.

As with the first embodiment, with the second embodiment, by increasing or decreasing the voltage on the MUTE node of transistor T1' more or less current can be caused to flow through transistors T2' and T3'. By changing the amount of current through transistors T2' and T3', the amount of current drawn through resistor R8' can be altered to change the R8' voltage drop. The voltage drop across resistor R8' is really a measure of the biasing voltage $V_{GS}$ produced at the gate-to-source junction of the VFETs V1' and V2'. Thus, by adjusting the first transistors current we can adjust the quiescent operating points of V1' and V2' without effecting the gate-to-source bias coefficient term.

Figure 1:
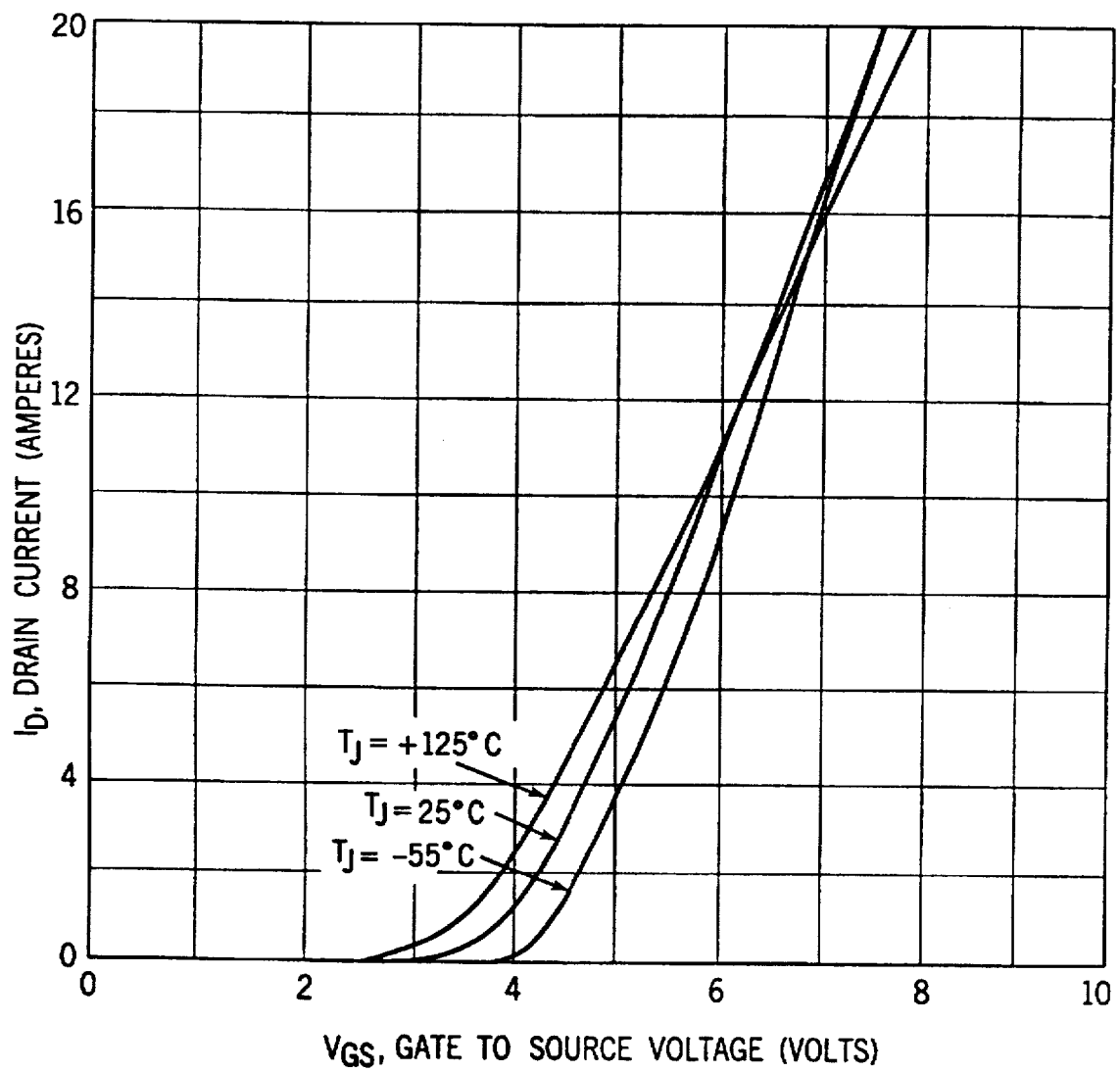
FIG. 1 is a graph illustrating the transfer curve of a n-channel enhancement type VFET.

Although the preferred embodiment of the invention has been described above, the invention claimed is not so restricted. For example, while a simple differential amplifier is shown, clearly, more complex types of differential amplifiers could be used with the present differential mirror. In addition, various types of protective circuitry could be used to protect the output stage from surges or the like. In addition, while one example of resistor values has been provided, any set of resistor ratio (i.e. 4 to 1 or 9 to 1) could be used to bias the VFETs given different biasing voltage changes based on temperature (i.e. $V_{be}$ may be –3 mV/°C. for some devices) through adjacent junction transistors. An equation which can be used to determine proper R4, R5 and R8 values based on changing base-to-emitter voltages $\Delta V_{be}$ of the mirror transistors T6 and T7 and changing gate-to-source voltages $\Delta V_{GS}$ of the VFETs for the first embodiment shown in FIG. 1 is:

$$R5 = 2 \left( \frac{\Delta V_{GS}}{\Delta V_{be}} \right) R4 \qquad (3)$$

where resistor R8 is equal to resistor R5. Moreover, the sixth and seventh resistors R6, R7 may not even be needed under certain circumstances.

Furthermore, the conveyor stage 20 of the first embodiment (FIG. 2) could be used with the feedback stage 38 of the second embodiment or, for that matter, many versions of current conveyors, mirrors or amplifying stages in general, could be used to practice the invention, the important distinction being that the output device temperature sensing stage not only generates the temperature coefficient necessary to achieve temperature independent output device idle current, but does so in a manner that locks the signal conveying stage's current precisely and invariably to the temperature sensing stage's reference point. In this manner error in the idle current programming coefficient due to drift in the conveyor stage is eliminated. Furthermore, the "programming" of the idle current is effected around the actual amplifying element of the driver itself. That is to say the aforementioned stages not only program the output stage for temperature independent idle current, but these stages, to a high degree, constitute the actual amplifying elements themselves. This synergy where both output stage biasing and driver amplifying elements are imploded into one another is a key feature of the invention.

Thus, the invention is not limited by the specific description above, rather it should be judged by the claims which follow:

I claim:

1. The input stage of an audio amplifier for use with an output stage having first and second N-channel VFETS, each VFET having a gate terminal and a source terminal, VFET gate-to-source biasing voltages dropping as VFET temperature increases, the amplifier providing positive and negative DC voltage sources, the input stage comprising:

a feedback means including at least one transistor that is linked to the VFETs such that the VFET gate-to-source biasing voltages are dependent upon a potential drop associated with the transistor, the transistor potential drop decreasing as transistor temperature increases, the transistor located proximate the VFETs so that the transistor temperature is effected by a VFET temperature;

wherein, as the VFET temperature changes, the transistor voltage drop changes so as to substantially maintain the VFET gate-to-source biasing voltages within a desired region.

2. The input stage of claim 1 wherein the transistor voltage drop is the base-to-emitter voltage drop of the feedback transistor.

3. The input stage of claim 2 wherein the amplifier receives an audio input signal on an input line and produces an output signal on an output line, the at least one transistor is a feedback transistor and the feedback means include:

first, second, and third biasing resistors;

first and second differencing transistors and a constant current source, each differencing transistor having base, emitter and collector terminals, the emitters connected to the constant current source and the bases connected to the input and output lines respectively;

a current conveyor stage including first and second conveying transistors having base, emitter and collector terminals, the first and second conveying transistor bases linked to the first and second differencing transistor collectors respectively, the first and second conveying transistor emitters linked to the positive DC voltage source through the first biasing resistor, the first conveying transistor collector linked to the negative voltage source through the second biasing resistor and to the gate terminal of the first VFET and the second conveying transistor collector linked to the output line through the third biasing resistor and to the gate terminal of the second VFET;

a feedback stage including the feedback transistor having base, emitter and collector terminals, the feedback transistor emitter linked to the positive voltage source, the feedback transistor base linked to the positive voltage source through the first biasing resistor and the feedback transistor collector linked to the differencing transistors' emitters; and whereby, the feedback transistor locks an emitter to collector current through each of the first and second conveying transistors so as to program the gate-to-source biasing voltages.

4. The input stage of claim 3 wherein the emitter of the feedback transistor is connected to the positive DC voltage source by way of a fourth biasing resistor.

5. The input stage of claim 3 wherein the second and third biasing resistors have identical resistive values and the ratio of resistance between the second and first biasing resistors is between four to one and nine to one.

6. The input stage of claim 3 wherein the second and third biasing resistors have equal resistance, the VFET gate-to-source biasing voltages and feedback transistor base-to-emitter biasing voltages are characterized by specific voltage drops $\Delta V_{GS}$ and $\Delta V_{be}$ respectively, per increase in temperature, and the ratio of first R1 to third R3 biasing resistors is:

$$R1 = 2\left(\frac{\Delta V_{GS}}{\Delta V_{be}}\right)R3.$$

7. The input stage of an audio amplifier for use with an output stage having first and second N-channel VFETS, the amplifier receiving an audio input signal on an input line and producing an output signal on an output line, the amplifier also providing positive and negative DC voltage sources, each VFET having a gate terminal, the input stage comprising:

first, second, and third biasing resistors;

first and second differencing transistors and a constant current source, each differencing transistor having base, emitter and collector terminals, the emitters connected to the constant current source and the bases connected to the input and output lines respectively;

a current conveyor stage including first and second conveying transistors having base, emitter and collector terminals, the first and second conveying transistor bases linked to the first and second differencing transistor collectors respectively, the first and second conveying transistor emitters linked to the positive DC voltage source through the first biasing resistor, the first conveying transistor collector linked to the negative voltage source through the second biasing resistor and to the gate terminal of the first VFET and the second conveying transistor collector linked to the output line through the third biasing resistor and to the gate terminal of the second VFET;

a feedback stage including a feedback transistor having base, emitter and collector terminals, the feedback transistor emitter linked to the positive voltage source, the feedback transistor base linked to the positive voltage source through the first biasing resistor and the feedback transistor collector linked to the differencing transistors' emitters; and whereby, the feedback transistor locks an emitter to collector current through each of the first and second conveying transistors so as to program the gate voltages at the VFET gate terminals into a desired region despite temperature changes.

8. The input stage of claim 7 wherein the desired region is between 2 and 4 volts.

9. The input stage of claim 7 wherein the desired region is between 2.5 and 3.5 volts.

10. The input stage of claim 7 wherein the first VFET includes a drain connected to the positive DC voltage source and a source connected to the output line, and the second VFET includes a drain connected to the output line and a source connected to the negative DC voltage source.

11. The input stage of claim 7 wherein the emitter of the feedback transistor is connected to the positive DC voltage source by way of a fourth biasing resistor.

12. The input stage of claim 7 wherein the second and third biasing resistors have identical resistive values and the ratio of resistance between the second and first biasing resistors is between four to one and nine to one.

13. The input stage of claim 12 wherein the resistive ratio is approximately 6 to 1.

14. The input stage of claim 7 wherein the current conveyor stage also includes third and fourth conveying transistors each having base, emitter and collector terminals, the third and fourth conveying transistor collectors linked to the positive voltage source through the first biasing resistor, the third and fourth conveying transistor bases linked to the first and second conveying transistor collectors respectively, and the third and fourth conveying transistor emitters linked to the gate terminals of the first and second VFETs respectively.

15. The input stage of claim 12 wherein the current conveyor also includes fifth and sixth biasing resistors, the fifth biasing resistor linked between the third conveying transistor base and emitter and the sixth biasing resistor linked between the fourth conveying transistor base and emitter.

16. The input stage of claim 7 further including seventh and eighth biasing resistors, the seventh biasing resistor linking the first differencing transistor collector to the positive voltage source and the seventh biasing resistor linking the second differencing transistor collector to the positive voltage source.

* * * * *